(12) United States Patent
Lin et al.

(10) Patent No.: US 12,730,147 B2
(45) Date of Patent: Sep. 8, 2026

(54) TESTING CIRCUIT FOR TESTING ELECTRICAL DEVICES AND DEVICE UNDER TEST

(71) Applicant: Winbond Electronics Corp., Taichung City (TW)

(72) Inventors: Lih-Wei Lin, Hsinchu City (TW); Chia-Fu Liang, Hsinchu County (TW)

(73) Assignee: Winbond Electronics Corp., Taichung City (TW)

( * ) Notice: Subject to any disclaimer, the term of this patent is extended or adjusted under 35 U.S.C. 154(b) by 135 days.

(21) Appl. No.: 18/621,011

(22) Filed: Mar. 28, 2024

(65) Prior Publication Data

US 2025/0216455 A1 Jul. 3, 2025

(30) Foreign Application Priority Data

Jan. 3, 2024 (TW) ................................ 113100291

(51) Int. Cl.
*G01R 31/317* (2006.01)

(52) U.S. Cl.
CPC . *G01R 31/31725* (2013.01); *G01R 31/31713* (2013.01)

(58) Field of Classification Search
None
See application file for complete search history.

(56) References Cited

U.S. PATENT DOCUMENTS 8,952,497 B2 * 2/2015 Chen ........................ H10P 54/00 257/E23.179
2002/0135394 A1 * 9/2002 Ahn ........................ G11C 7/222 711/167
2009/0295404 A1 * 12/2009 Matsumoto ........ G01R 31/3191 324/555
2011/0253999 A1 * 10/2011 Chatterjee .......... G01R 31/2884 257/E23.179
2019/0181063 A1 * 6/2019 Liao ...................... H10P 74/273
2020/0303030 A1 * 9/2020 Lee ...................... G11C 7/1096

* cited by examiner

*Primary Examiner* — Guerrier Merant
(74) *Attorney, Agent, or Firm* — JCIPRNET

(57) ABSTRACT

A testing circuit for testing a plurality of electrical devices is provided. The testing circuit includes a first pad and a plurality of delay circuits. The first pad is disposed on a scribe line of a substrate. The first pad is configured to receive a trigger signal to trigger the electrical devices to sequentially perform a testing operation. The electrical devices are disposed on the substrate. The delay circuits are disposed on the scribe line of the substrate. The delay circuits are electrically connected to the first pad. The delay circuits are configured to delay the trigger signal and output the delayed trigger signal to the corresponding electrical devices. The electrical devices sequentially perform the testing operation according to the delayed trigger signal to respectively output a testing result.

20 Claims, 10 Drawing Sheets

TESTING CIRCUIT FOR TESTING ELECTRICAL DEVICES AND DEVICE UNDER TEST

CROSS-REFERENCE TO RELATED APPLICATION

This application claims the priority benefit of Taiwan application serial no. 113100291, filed on Jan. 3, 2024. The entirety of the above-mentioned patent application is hereby incorporated by reference herein and made a part of this specification.

BACKGROUND

Technical Field

The disclosure relates to a testing circuit and a device under test, and particularly relates to a testing circuit for testing a plurality of electrical devices and a device under test including the testing circuit.

Description of Related Art

Generally speaking, electrical devices such as chips can be tested before or after packaging. For example, probe testing may be performed on the electrical devices before packaging. However, the cost of probe testing is high, and when the number of identical tests of the electrical devices is high, the output of the device under test is prone to collision on a data bus.

SUMMARY

The disclosure provides a testing circuit and a device under test, which can reduce the testing cost and prevent collision from occurring to the output of the device under test on a data bus.

A testing circuit of the disclosure is configured to test a plurality of electrical devices. The testing circuit includes a first pad and a plurality of delay circuits. The first pad is disposed on a scribe line of a substrate. The first pad is configured to receive a trigger signal to trigger the electrical devices to sequentially perform a testing operation. The electrical devices are disposed on the substrate. The delay circuits are disposed on the scribe line of the substrate. The delay circuits are electrically connected to the first pad. The delay circuits are configured to delay the trigger signal and output the delayed trigger signal to the corresponding electrical devices. The electrical devices sequentially perform the testing operation according to the delayed trigger signal so as to respectively output a testing result.

A device under test of the disclosure includes a plurality of electrical devices and a testing circuit. The electrical devices are disposed on a substrate. The testing circuit includes a first pad and a plurality of delay circuits. The first pad is disposed on a scribe line of the substrate. The first pad is configured to receive a trigger signal to trigger the electrical devices to sequentially perform a testing operation. The electrical devices are disposed on the substrate. The delay circuits are disposed on the scribe line of the substrate. The delay circuits are electrically connected to the first pad. The delay circuits are configured to delay the trigger signal and output the delayed trigger signal to the corresponding electrical devices. The electrical devices sequentially perform the testing operation according to the delayed trigger signal so as to respectively output a testing result.

In an embodiment of the disclosure, the testing circuit further includes a plurality of second pads. The second pads are disposed on the scribe line of the substrate and electrically connected to the electrical devices. The second pads are configured to receive a clock signal, a power signal, and a test command and output the clock signal, the power signal, and the test command to the electrical devices. The electrical devices perform the testing operation according to the clock signal, the power signal, and the test command.

In an embodiment of the disclosure, each of the electrical devices further includes a logic circuit, a built-in self-test circuit, and a data bus. The logic circuit is electrically connected to the second pads. The logic circuit is configured to receive and output the clock signal and test command. The built-in self-test circuit is electrically connected to the logic circuit. The built-in self-test circuit is configured to perform the testing operation according to the clock signal and test command. The data bus is electrically connected to the built-in self-test circuit. The data bus is configured to output the testing result.

In an embodiment of the disclosure, each of the electrical devices includes an input pad. The input pad is electrically connected to the corresponding delay circuit. The input pad is configured to receive and output the delayed trigger signal.

In an embodiment of the disclosure, each of the electrical devices further includes a storage circuit. The storage circuit is electrically connected to the input pad. The storage circuit is configured to receive the delayed trigger signal and store a latency counter value of the electrical device.

In an embodiment of the disclosure, the data bus is further electrically connected to the storage circuit. The data bus is configured to output the testing result according to the latency counter value.

In an embodiment of the disclosure, the latency counter values of the electrical devices may be different.

In an embodiment of the disclosure, the logic circuit is further electrically connected to the input pad. The logic circuit is configured to receive and output the delayed trigger signal. The built-in self-test circuit is also configured to perform the testing operation according to the delayed trigger signal so as to output the testing result.

In an embodiment of the disclosure, each of the electrical devices is a memory chip.

DESCRIPTION OF THE EMBODIMENTS

Figure 1:
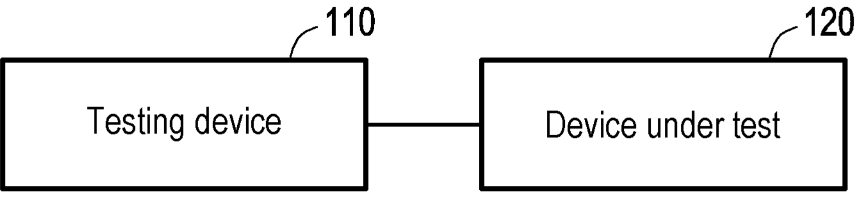
FIG. 1 is a schematic block diagram of a testing system according to an embodiment of the disclosure.
Figure 2:
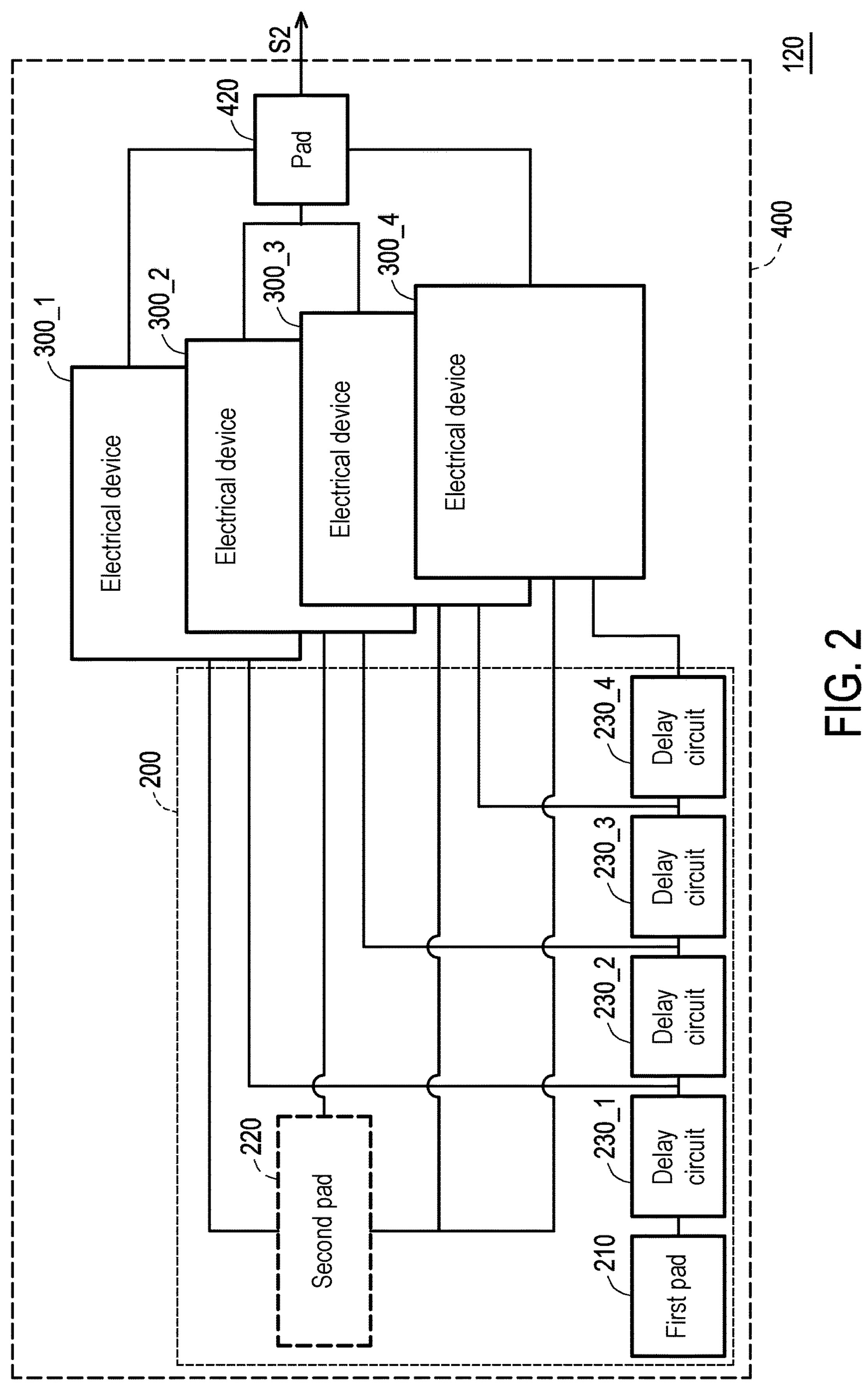
FIG. 2 is a schematic outline diagram of the device under test according to the embodiment of FIG. 1 of the disclosure.

FIG. 1 is a schematic block diagram of a testing system according to an embodiment of the disclosure. FIG. 2 is a schematic outline diagram of the device under test according to the embodiment of FIG. 1. Referring to FIG. 1 and FIG. 2, a testing system 100 of the embodiment includes a testing device 110 and a device under test 120. The device under test 120 is electrically connected to the testing device 110. The device under test 120 includes a testing circuit 200 and a plurality of electrical devices 300_1, 300_2, 300_3, and 300_4. The testing circuit 200 is configured to test the electrical devices 300_1, 300_2, 300_3, and 300_4. The electrical devices 300_1, 300_2, 300_3, and 300_4 are disposed on a substrate (for example, a chip) 400. The testing device 110 performs a testing operation on the electrical devices 300_1, 300_2, 300_3, and 300_4 through the testing circuit 200.

In an embodiment, each of the electrical devices 300_1, 300_2, 300_3, and 300_4 is, for example, a memory chip of the device under test (DUT). In an embodiment, the electrical device may also be a digital logic chip or an analog circuit chip. The testing device 110 uses a probe to pass through the testing circuit 200 so as to perform wafer probing on the electrical devices 300_1, 300_2, 300_3, and 300_4. However, the disclosure does not limit the types of testing operations and the types and quantities of electrical devices.

Figure 3:
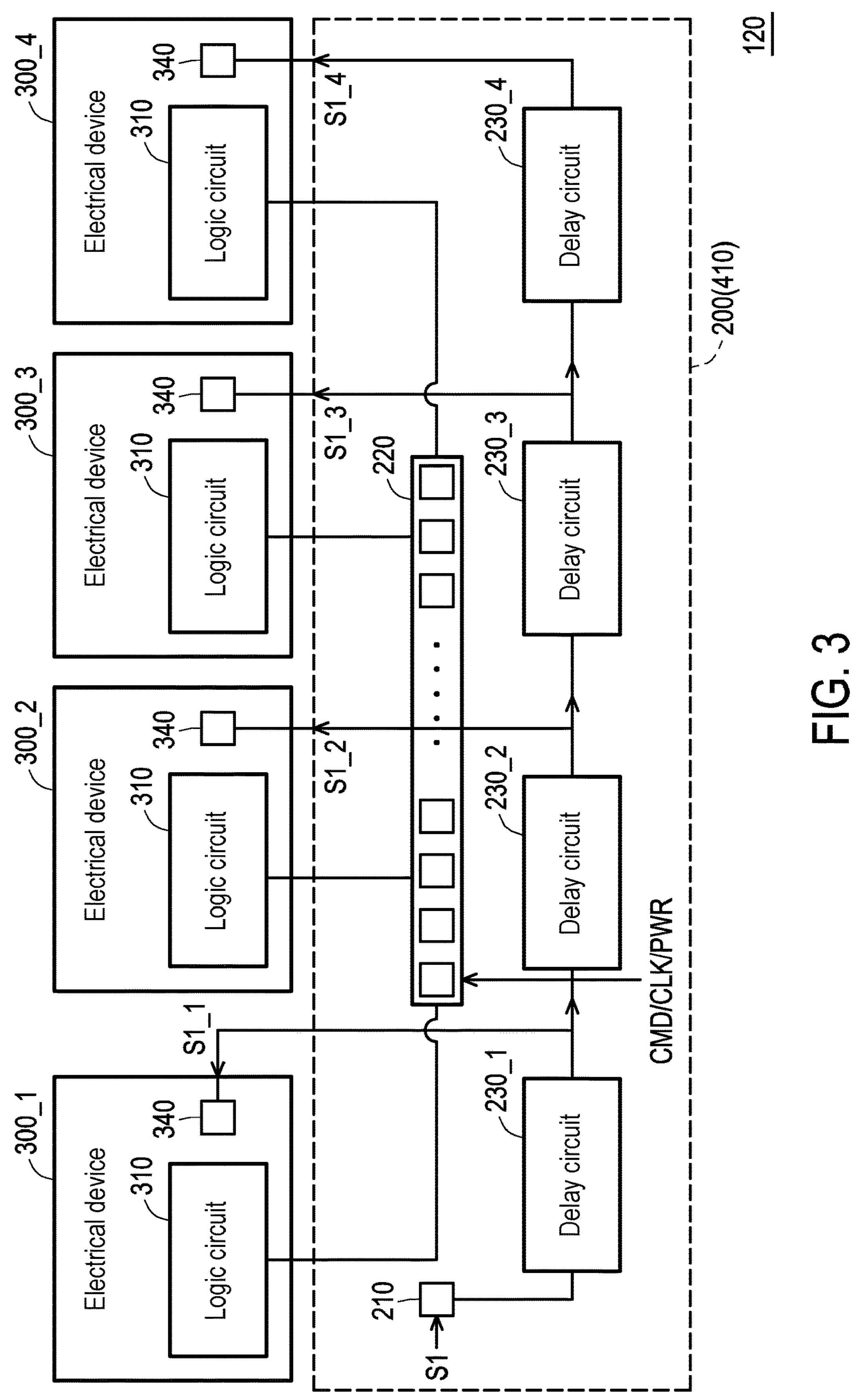
FIG. 3 is a schematic layout diagram of the device under test according to the embodiment of FIG. 1 of the disclosure.

FIG. 3 is a schematic layout diagram of the device under test according to the embodiment of FIG. 1. Referring to FIG. 2 and FIG. 3, the testing circuit 200 includes a first pad 210, a plurality of delay circuits 230_1, 230_2, 230_3, and 230_4, and a plurality of second pads 220.

The first pad 210 is disposed on a scribe line 410 of the substrate 400. The first pad 210 is configured to receive a trigger signal S1 to trigger the electrical devices 300_1, 300_2, 300_3, and 300_4 to sequentially perform a testing operation. The trigger signal S1 comes from the testing device 110, for example.

The delay circuits 230_1, 230_2, 230_3, and 230_4 are disposed on the scribe line 410 of the substrate 400. The delay circuits 230_1, 230_2, 230_3, and 230_4 are electrically connected to the first pad 210. The delay circuits 230_1, 2302, 230_3, and 230_4 are configured to delay the trigger signal S1 and output delayed trigger signals S1_1, S1_2, S1_3, and S1_4 to the corresponding electrical devices 300_1, 3002, 300_3, and 300_4. For example, the delay circuit 230_1 delays the trigger signal S1 and outputs the delayed trigger signal S1_1 to the electrical device 300_1 and the delay circuit 230_2. The delay circuit 230_2 delays the trigger signal S1_1 and outputs the delayed trigger signal S1_2 to the electrical device 300_2 and the delay circuit 230_3, and so on. The electrical devices 300_1, 300_2, 300_3, and 300_4 receive the delayed trigger signals S1_1, S1_2, S1_3, and S1_4 through respective input pads 340. Then, the electrical devices 300_1, 300_2, 300_3, and 300_4 sequentially perform the testing operation according to the delayed trigger signals S1_1, S1_2, S1_3, and S1_4 so as to respectively output a testing result S2. In the embodiment, the testing result S2 is output by, for example, the same pad 420 shown in FIG. 2.

Figure 8:
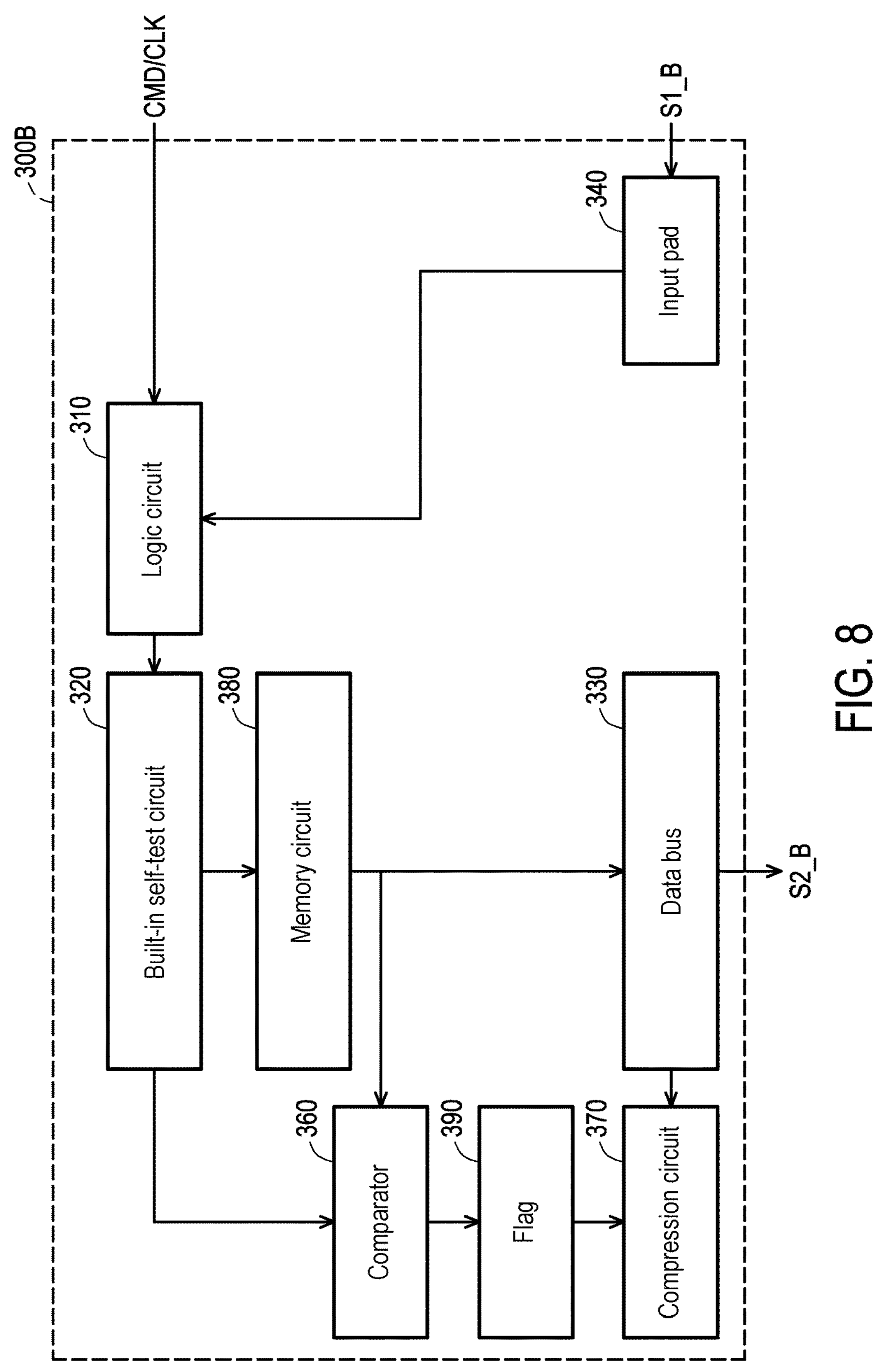
FIG. 8 is a schematic outline diagram of an electrical device according to an embodiment of the disclosure.

The second pads 220 are disposed on the scribe line 410 of the substrate 400. The second pads 220 are electrically connected to the electrical devices 300_1, 300_2, 300_3, and 300_4. The second pads are configured to receive a clock signal CLK, a power signal PWR and a test command CMD and output the clock signal CLK, the power signal PWR, and the test command CMD to the electrical devices 300_1, 300_2, 300_3, and 300_4. The electrical devices 300_1, 300_2, 300_3, and 300_4 receive the delayed trigger signals S1_1, S1_2, S1_3, and S1_4 through respective logic circuits 310. Then, the electrical device performs the testing operation according to the clock signal CLK, the power signal PWR, and the test command CMD. In the embodiment of the disclosure, depending on varying operating modes, the test command CMD may be a write command CMD1 (FIG. 5) or a read command CMD2 (FIG. 6, FIG. 8).

Figure 4:
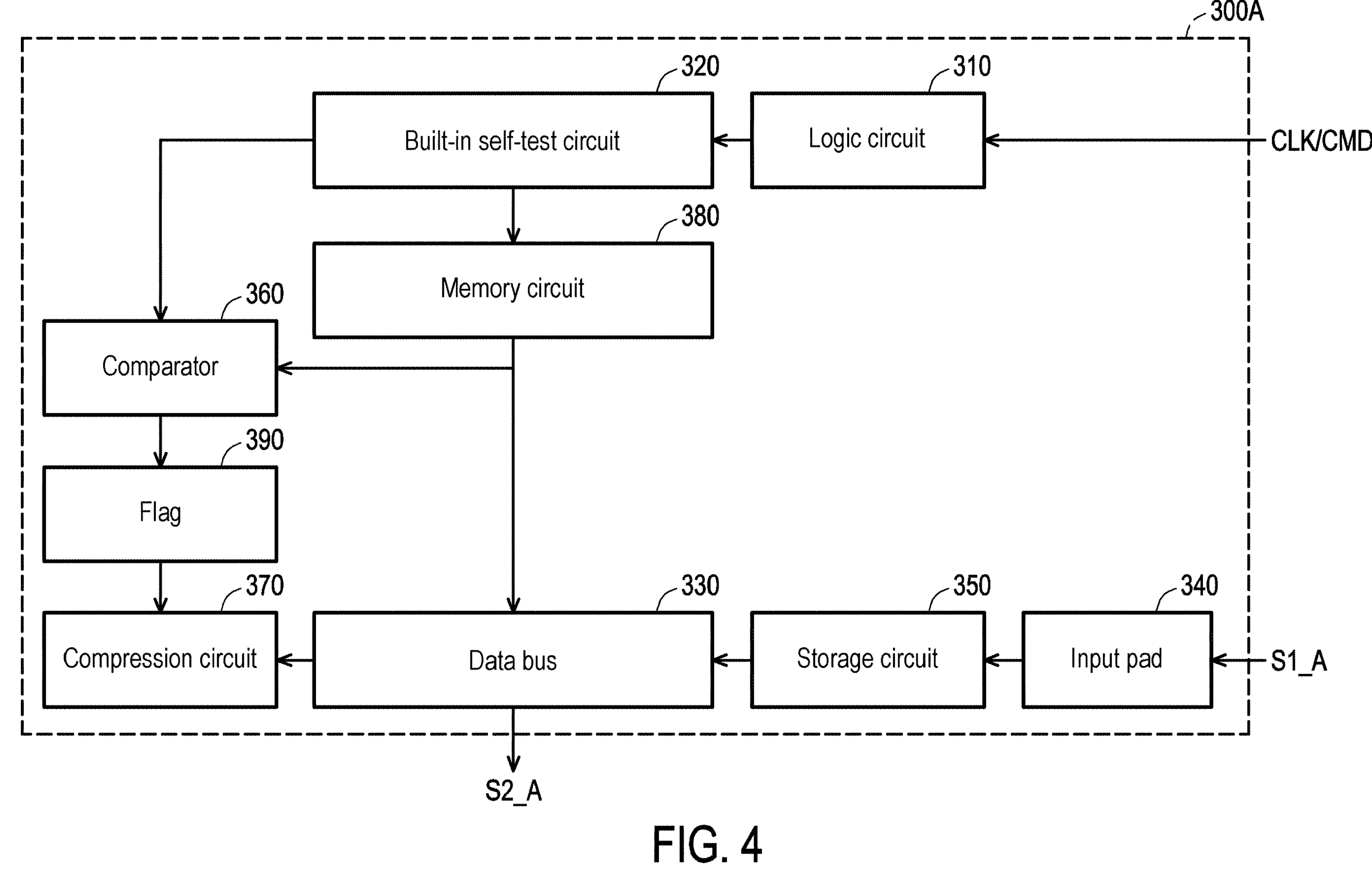
FIG. 4 is a schematic outline diagram of an electrical device according to the disclosure.

FIG. 4 is a schematic outline diagram of an electrical device according to an embodiment of the disclosure. Referring to FIG. 4, an electrical device 300A of the embodiment includes a logic circuit 310, a built-in self-test circuit 320, a data bus 330, an input pad 340, and a storage circuit 350. The electrical device 300A further includes a comparator 360, a compression circuit 370, and a memory circuit 380. The memory circuit 380 is a circuit under test. The electrical device 300A is an implementation of the electrical devices 300_1, 300_2, 300_3, and 300_4.

The logic circuit 310 is electrically connected to the second pads 220. The logic circuit 310 is configured to receive and output the clock signal CLK and the test command CMD. The logic circuit 310 may, for example, perform a decoding operation on the test command CMD. The built-in self-test (BIST) circuit 320 is electrically connected to the logic circuit 310. The built-in self-test circuit 320 is configured to perform the testing operation according to the clock signal CLK and the test command CMD. The data bus 330 is electrically connected to the built-in self-test circuit 320 through the memory circuit 380. The data bus 330 is configured to output a testing result S2_A.

On the other hand, the input pad 340 is electrically connected to the corresponding delay circuit 230_1, 230_2, 230_3, or 230_4. The input pad 340 is configured to receive and output a delayed trigger signal S1_A. The storage circuit 350 is electrically connected to the input pad 340. The storage circuit 350 is configured to receive the delayed trigger signal S1_A and store a latency counter value of the electrical device 300A. The storage circuit 350 may be a register, a volatile memory circuit, or a non-volatile memory circuit. The data bus 330 is further electrically connected to the storage circuit 350. The data bus 330 is configured to output the testing result S2_A according to the latency counter value stored in the storage circuit 350.

In addition, the comparator 360 is configured to compare the testing pattern provided by the built-in self-test circuit 320 and the data output by the memory circuit 380 and present the comparison result in the form of a flag 390, for example, as a digital value 1 to represent that the test passes, and the digital value 0 to represent that the test fails. Then, after compressing the flag 390, the compression circuit 370 outputs the same to the data bus 330 as the testing result S2_A.

The electrical device 300A of the embodiment can operate in a first operating mode or a second operating mode. In the first operating mode, the latency counter value of the electrical device 300A is written to the storage circuit 350. In the second operating mode, the testing result S2_A is read from the electrical device 300A.

In addition, in the embodiment, the structure of the logic circuit 310, the built-in self-test circuit 320, the data bus 330, the storage circuit 350, the comparator 360, and the compression circuit 370 can be respectively implemented by suitable digital circuits or analog circuits in the technical field, which is not limited by the disclosure.

Figure 5:
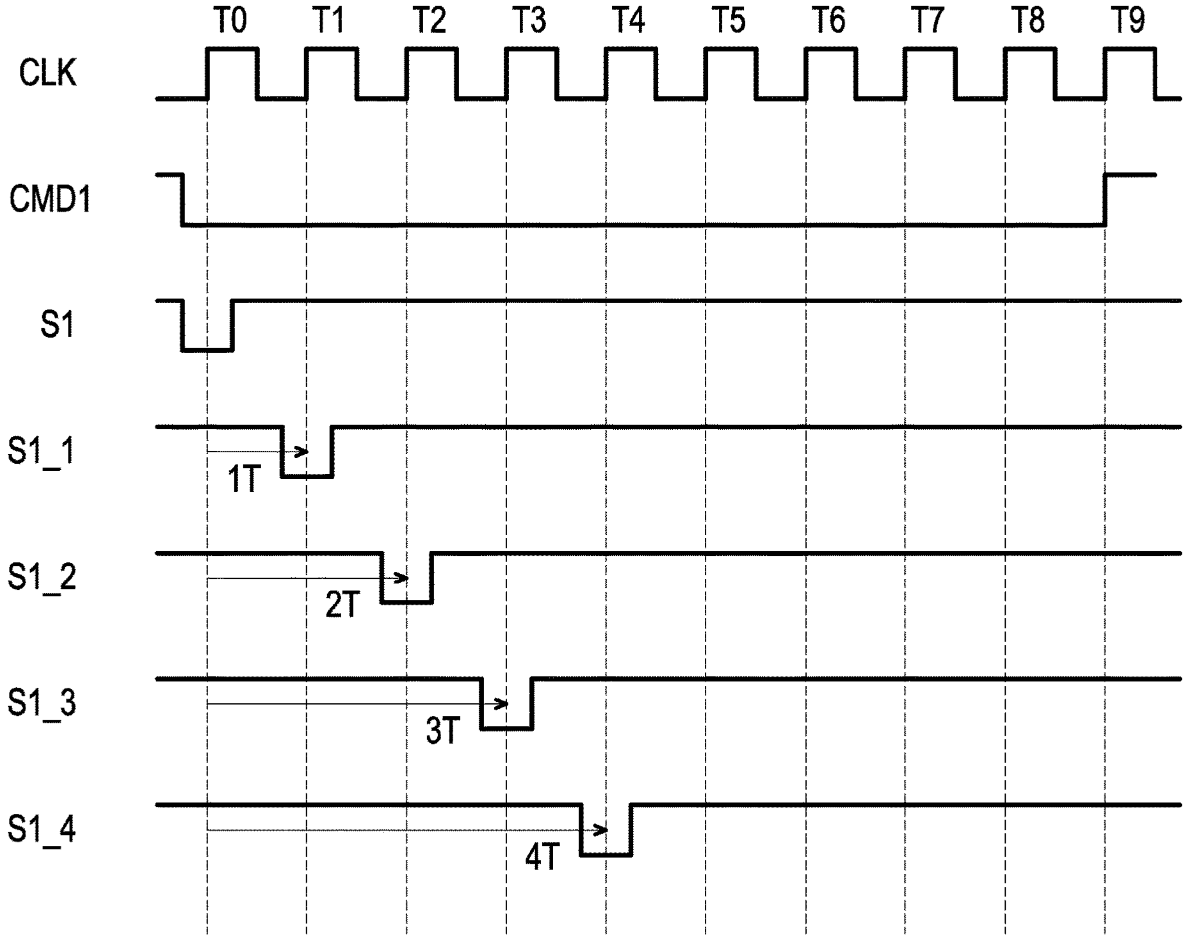
FIG. 5 is a schematic diagram of a signal waveform of the electrical device according to the embodiment of FIG. 4 of the disclosure in a first operating mode.
Figure 6:
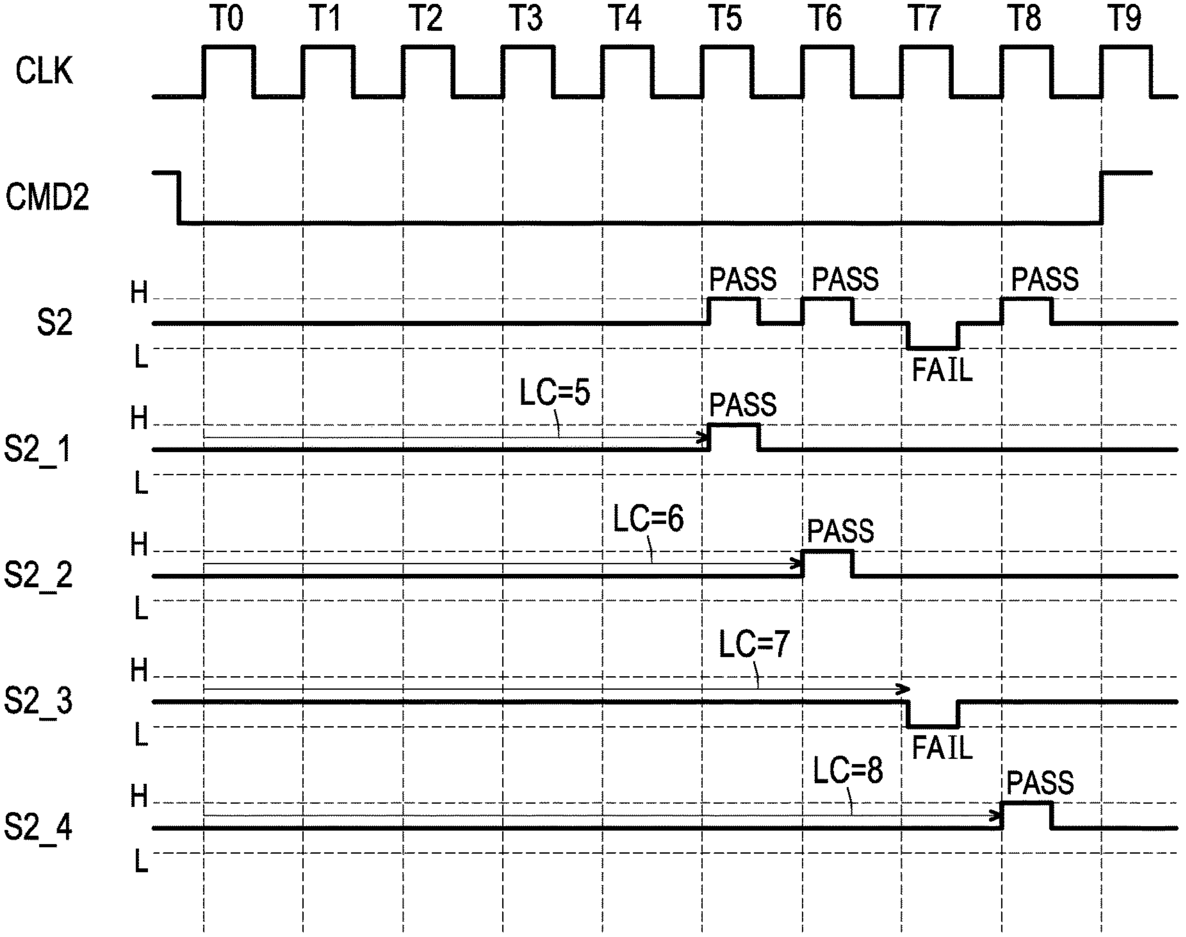
FIG. 6 is a schematic diagram of a signal waveform of the electrical device according to the embodiment of FIG. 4 of the disclosure in a second operating mode.

FIG. 5 is a schematic diagram of a signal waveform of the electrical device of the embodiment of FIG. 4 in a first operating mode. Referring to FIG. 3 to FIG. 5, the clock signal CLK and the write command CMD1 are input from the second pads 220. The clock signal CLK includes operating timings T0, T1, T2, T3, T4, T5, and T6. The write command CMD1 instructs the electrical devices 300_1, 300_2, 300_3, and 300_4 to write the latency counter value to the respective storage circuits 350.

The trigger signal S1 is input from the first pad 210 and transmitted to the delay circuit 230_1. The delay circuit 230_1 delays the trigger signal S1 and outputs the delayed trigger signal S1_1 to the electrical device 300_1 and the delay circuit 230_2. Therefore, compared with the trigger signal S1, the trigger signal S1_1 is delayed by a time period, which is marked as 1T in FIG. 5. Then, the delay circuit 230_2 delays the trigger signal S1_1 and outputs the delayed trigger signal S1_2 to the electrical device 300_2 and the delay circuit 230_3. Therefore, compared with the trigger signal S1, the trigger signal S1_2 is delayed by two time periods, which is marked as 2T in FIG. 5. By analogy, compared with the trigger signal S1, the trigger signals S1_3 and S1_4 are delayed by three time periods and four time periods respectively, which are marked as 3T and 4T in FIG. 5.

On the other hand, the write command CMD1 includes information of a reference counter value. In the embodiment, the reference counter value is, for example, preset to 4T. The latency counter values stored in the storage circuits 350 of the electrical devices 300_1, 300_2, 300_3, and 300_4 are respectively 5T (i.e., 1T+4T), 6T (i.e., 2T+4T), 7T (i.e., 3T+4T), and 8T (i.e., 4T+4T). That is to say, through the delay circuits 230_1, 230_2, 230_3, and 230_4, the trigger signal S1 input from the first pad 210 can be transmitted to the input pads 340 of the electrical devices 300_1, 300_2, 300_3, and 300_4 with different time differences. Moreover, in conjunction with the setting of the reference counter value of the write command CMD1, the latency counter values stored in the storage circuits 350 of the electrical devices 300_1, 300_2, 300_3, and 300_4 can be sequentially defined as 5T, 6T, 7T, and 8T. That is to say, the latency counter values of the electrical devices 300_1, 300_2, 300_3, and 300_4 are different. The latency counter values stored in the respective storage circuits 350 represent the order in which testing results S2_1, S2_2, S2_3, and S2_4 are read from the electrical devices 300_1, 300_2, 300_3, and 300_4 when the electrical devices 300_1, 300_2, 300_3, and 300_4 operate in the second operating mode.

FIG. 6 is a schematic diagram of a signal waveform of the electrical device of the embodiment of FIG. 4 in a second operating mode. Referring to FIG. 3, FIG. 4, and FIG. 6, the clock signal CLK and the read command CMD2 are input from the second pads 220. The clock signal CLK includes operating timings T0, T1, T2, T3, T4, T5, T6, T7, T8, and T9. The read command CMD2 instructs the electrical devices 300_1, 300_2, 300_3, and 300_4 to output the respective testing results S2_1, S2_2, S2_3, and S2_4. In FIG. 6, H represents the high level of the signal, L represents the low level of the signal, LC represents the latency counter value, PASS represents the test passes, and FAIL represents the test fails.

In the embodiment, the latency counter values LC of the electrical devices 300_1, 300_2, 300_3, and 300_4 are respectively 5T, 6T, 7T, and 8T. Therefore, the electrical devices 300_1, 300_2, 300_3, and 300_4 respectively output the testing results S2_1, S2_2, S2_3, and S2_4 at the timings T5, T6, T7, T8, and T9. Furthermore, the testing result S2 is output by, for example, the same pad 420 shown in FIG. 2, which is not limited by the disclosure. In the embodiment, since the latency counter value has been written into the electrical device in the first operating mode, in the second operating mode, the testing results can be sequentially read from the electrical device to avoid collision of the testing results on the same pad.

Figure 7:
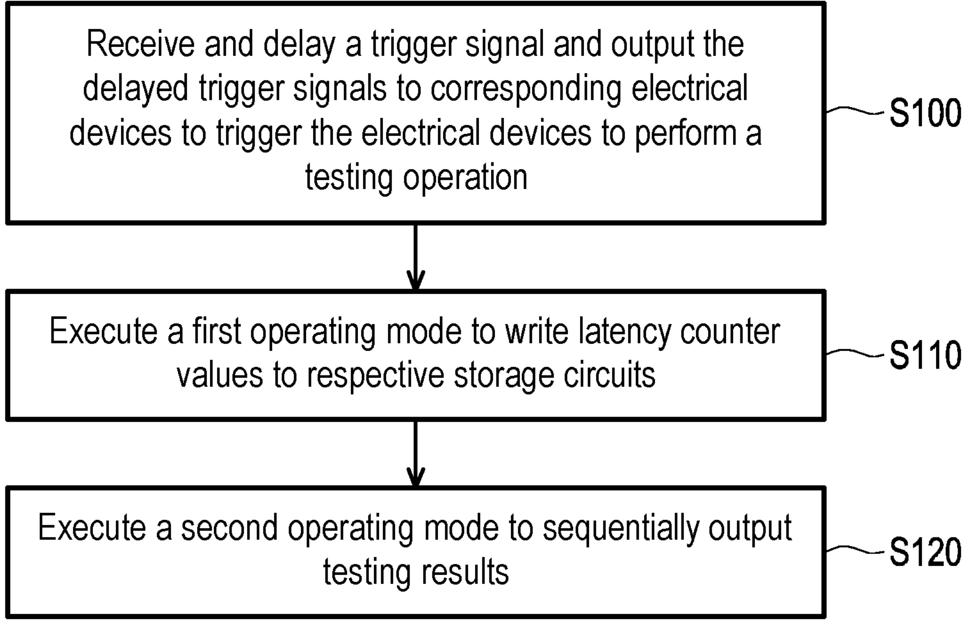
FIG. 7 is a step flowchart of a testing method according to an embodiment of the disclosure.

FIG. 7 is a step flowchart of a testing method according to an embodiment of the disclosure. Referring to FIG. 2 to FIG. 6, the testing method of the embodiment is applicable to at least the electrical devices 300_1, 300_2, 300_3, and 300_4 of FIG. 3 and FIG. 4, which is not limited by the disclosure. In step S100, the testing circuit 200 receives and delays the trigger signal S1 and outputs the delayed trigger signals S1_1, S1_2, S1_3, and S1_4 to the corresponding electrical devices 300_1, 300_2, 3003, and 300_4 to trigger the electrical devices 300_1, 300_2, 300_3, and 300_4 to perform a testing operation. In step S110, the electrical devices 300_1, 300_2 300_3, and 300_4 execute the first operating mode to write the latency counter value to the respective storage circuit 350. In step S120, the electrical devices 300_1, 300_2, 300_3, and 300_4 execute the second operating mode to sequentially output the testing results S2_1, S2_2, S2_3, and S2_4, and the testing result S2 is, for example, output by the same pad 420 shown in FIG. 2.

In addition, sufficient teachings, suggestions, and implementation instructions for the testing method of the embodiment of the disclosure can be obtained from the description of the embodiments of FIG. 1 to FIG. 6.

FIG. 8 is a schematic outline diagram of an electrical device according to an embodiment of the disclosure. Referring to FIG. 8, an electrical device 300B is another implementation of the electrical devices 300_1, 300_2, 300_3, and 300_4. The electrical device 300B of the embodiment is similar to the electrical device 300A of the embodiment of FIG. 4, but the main difference between the two lies in that the electrical device 300B does not include the storage circuit 350, and the electrical device 300B does not need to execute the first operating mode to write the latency counter value. In FIG. 8, the logic circuit 310 is further electrically connected to the input pad 340. The logic circuit 310 is configured to receive and output a delayed trigger signal S1_B. The built-in self-test circuit 320 is further configured to perform the testing operation according to the delayed trigger signal S1_B so as to output the testing result.

Figure 9:
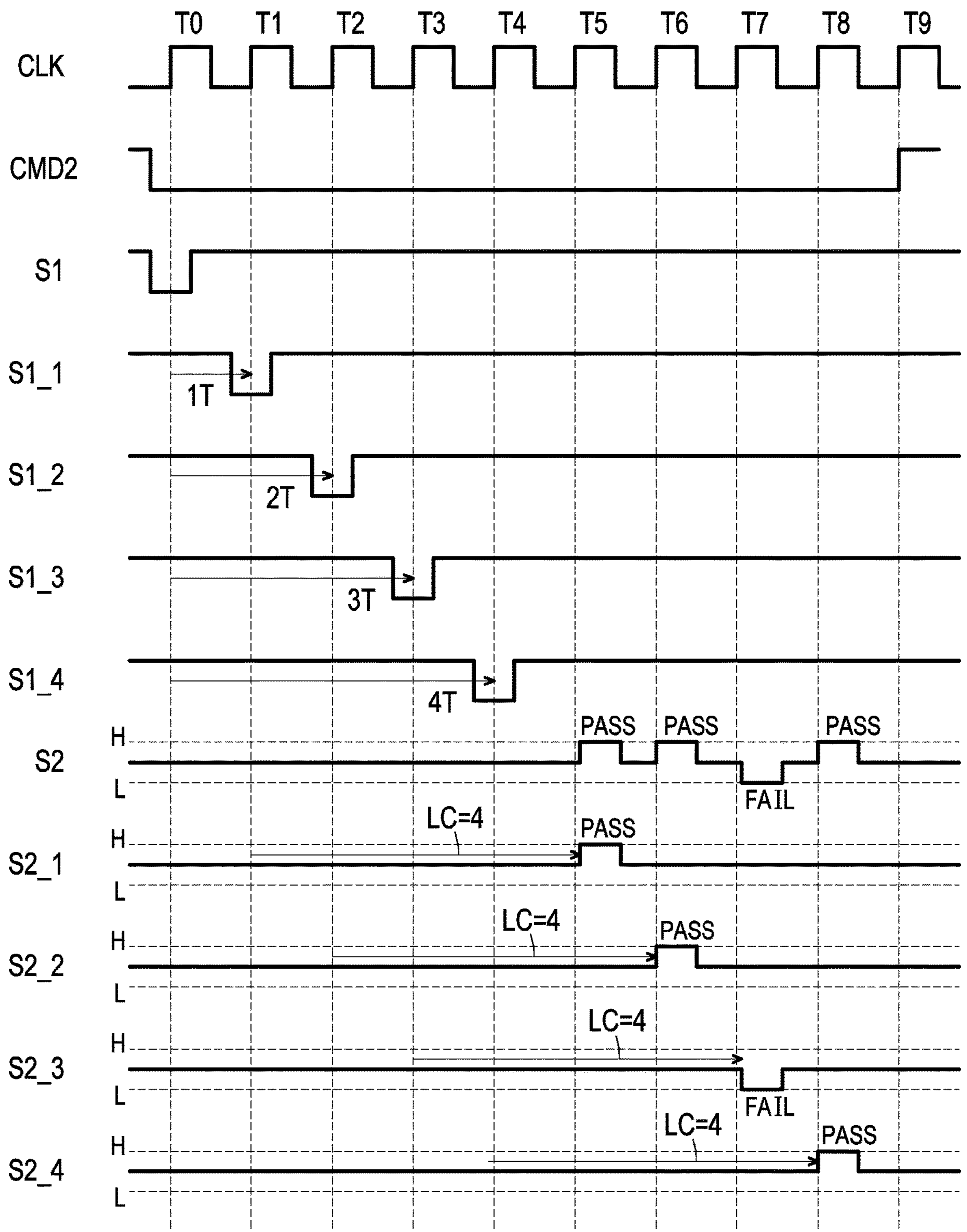
FIG. 9 is a schematic diagram of a signal waveform of the electrical device according to the embodiment of FIG. 8 of the disclosure in a second operating mode.

FIG. 9 is a schematic diagram of a signal waveform of the electrical device of the embodiment of FIG. 8 in a second operating mode. Referring to FIG. 3, FIG. 8, and FIG. 9, the clock signal CLK and the read command CMD2 are input from the second pads 220 to the corresponding electrical devices 300_1, 300_2, 300_3, and 300_4. The delayed trigger signals S1_1, S1_2, S1_3, and S1_4 are input from the respective input pads 340 to the corresponding electrical devices 300_1, 300_2, 300_3, and 300_4 to trigger the electrical devices 300_1, 300_2, 300_3, and 300_4 to perform the testing operation.

In the embodiment, the latency counter values LC of the electrical devices 300_1, 300_2, 300_3, and 300_4 are set to the same value, for example, 4T. Therefore, the electrical devices 300_1, 300_2, 300_3, and 300_4 respectively output the testing results S2_1, S2_2, S2_3, and S2_4 at the timings T5, T6, T7, T8, and T9. Furthermore, the testing result S2 is output by, for example, the same pad 420 shown in FIG. 2, which is not limited by the disclosure.

As for the trigger signals S1_1, S1_2, S1_3, and S1_4, the trigger signals S1_1, S1_2, S1_3, and S1_4 are generated by the delay circuits 230_1, 230_2, 230_3, 230_4. Since the trigger signals S1_1, S1_2, S1_3, and S1_4 arrive at the respective input pads 340 differently, the trigger signals S1_1, S1_2, S1_3, and S1_4 received by the electrical devices 300_1, 300_2, 300_3, and 300_4 will each differ by a time period. Then, the built-in self-test circuit 320 of the respective triggered electrical devices 300_1, 300_2, 300_3, and 300_4 sequentially performs the testing operation at the timings T1, T2, T3, and T4.

As for the testing results S2_1, S2_2, S2_3, and S2_4, by setting the latency counter values LC of the electrical devices 300_1, 300_2, 300_3, and 300_4 to the same value, for example, to 4T, the respective data buses 330 of the electrical devices 300_1, 300_2, 300_3, and 300_4 can sequentially output the testing results at the timings T5, T6, T7, and T8.

Therefore, in the embodiment, it is not necessary to write the latency counter values into the electrical devices 300_1, 300_2, 300_3, and 300_4 in advance. Instead, the latency counter value LC of each of the electrical devices 300_1, 300_2, 300_3, and 300_4 is set to the same value. Therefore, in the second operating mode, the testing results can be read sequentially from the electrical devices to avoid collision of the testing results on the same pad.

Figure 10:
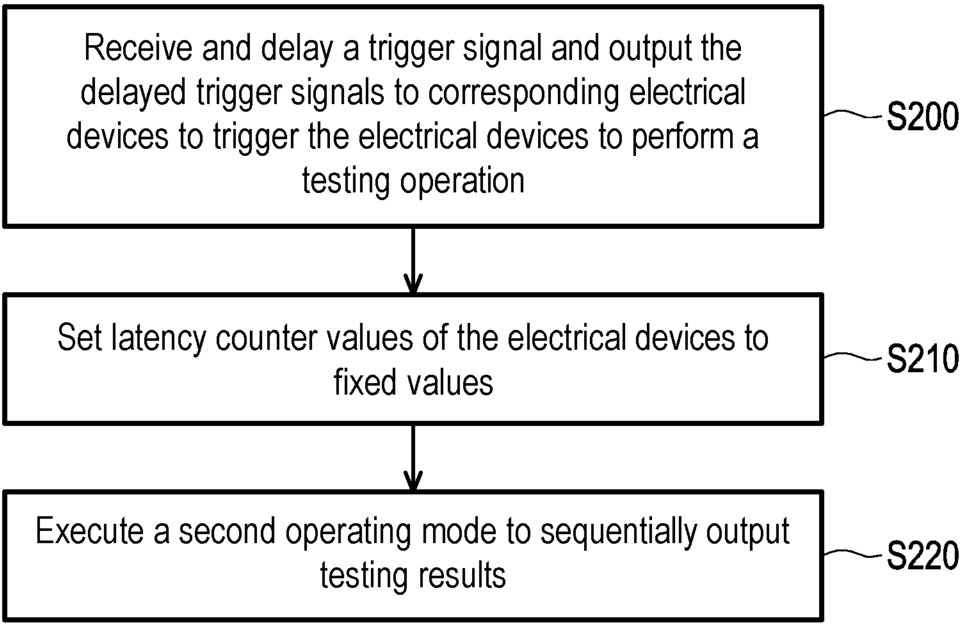
FIG. 10 is a step flowchart of a testing method according to another embodiment of the disclosure.

FIG. 10 is a step flowchart of a testing method according to another embodiment of the disclosure. Referring to FIG. 2, FIG. 3, FIG. 8, FIG. 9, and FIG. 10, the testing method of the embodiment is at least applicable to the electrical devices 300_1, 300_2, 300_3, and 300_4 of FIG. 3 and FIG. 8, which is not limited by the disclosure. In step S200, the testing circuit 200 receives and delays the trigger signal S1 and outputs the delayed trigger signals S1_1, S1_2, S1_3, and S1_4 to the corresponding electrical devices 300_1, 300_2, 300_3, and 300_4 to trigger the electrical devices 300_1, 300_2, 300_3, and 300_4 to perform the testing operation. In step S210, the testing device 110 sets the latency counter values of the electrical devices 300_1, 300_2, 300_3 and 300_4 to fixed values. In step S220, the electrical devices 300_1, 300_2, 300_3, and 300_4 execute the second operating mode to sequentially output the testing results S2_1, S2_2, S2_3, and S2_4, and the testing result S2 is, for example, output by the same pad 420 shown in FIG. 2.

In addition, sufficient teachings, suggestions, and implementation instructions for the testing method of the embodiment of the disclosure can be obtained from the description of the embodiments of FIG. 1 to FIG. 3 and FIG. 8.

To sum up, in the embodiment of the disclosure, testing is performed on the electrical device by disposing the testing circuit on the scribe line of the substrate. The testing circuit includes the delay circuit to allow the electrical devices to output the testing results at different times. This reduces the testing costs and avoids collision of the testing results on the same pad.

Although the disclosure has been described with reference to the embodiments above, the embodiments are not intended to limit the disclosure. Any person skilled in the art can make some changes and modifications without departing from the spirit and scope of the disclosure. Therefore, the scope of the disclosure will be defined in the appended claims.

What is claimed is:

1. A testing circuit, configured to test a plurality of electrical devices, wherein the testing circuit comprises:

a first pad, disposed on a scribe line of a substrate, and configured to receive a trigger signal to trigger the electrical devices to sequentially perform a testing operation, wherein the electrical devices are disposed on the substrate; and a plurality of delay circuits, coupled in series, disposed on the scribe line of the substrate, and electrically connected to the first pad, wherein the delay circuits are configured to delay the trigger signal in sequence to respectively output a plurality of delayed trigger signals to the corresponding electrical devices, and the electrical devices sequentially perform the testing operation according to the delayed trigger signals so as to respectively output a plurality of testing results, wherein each of the electrical devices comprises:

a storage circuit, being configured to receive the corresponding delayed trigger signal and store a latency counter value of the electrical device, wherein the latency counter value is obtained by adding a corresponding reference counter value with a delayed time period of corresponding delayed trigger signal, wherein each of the electrical devices determines a time point for outputting each of the testing results according to the latency counter value.

2. The testing circuit according to claim 1, wherein the testing circuit further comprises:

a plurality of second pads, disposed on the scribe line of the substrate, and electrically connected to the electrical devices, wherein the second pads are configured to receive a clock signal, a power signal, and a test command and output the clock signal, the power signal, and the test command to the electrical devices, wherein the electrical devices perform the testing operation according to the clock signal, the power signal, and the test command.

3. The testing circuit according to claim 2, wherein each of the electrical devices further comprises:

a logic circuit, electrically connected to the second pads, and configured to receive and output the clock signal and the test command;

a built-in self-test circuit, electrically connected to the logic circuit, and configured to perform the testing operation according to the clock signal and the test command; and a data bus, electrically connected to the built-in self-test circuit, and configured to output each of the testing results.

4. The testing circuit according to claim 3, wherein each of the electrical devices comprises:

an input pad, electrically connected to the corresponding delay circuit, and configured to receive and output the corresponding delayed trigger signal.

5. The testing circuit according to claim 4, wherein the storage circuit is electrically connected to the input pad, and configured to receive the corresponding delayed trigger signal from the input pad.

6. The testing circuit according to claim 5, wherein the data bus is electrically connected to the storage circuit and configured to output each of the testing results according to the latency counter value.

7. The testing circuit according to claim 5, wherein the latency counter values of the electrical devices are different.

8. The testing circuit according to claim 4, wherein the logic circuit is further electrically connected to the input pad and configured to receive and output the delayed trigger signal, and the built-in self-test circuit is further configured to perform the testing operation according to the corresponding delayed trigger signal so as to output each of the testing results.

9. The testing circuit according to claim 5, wherein the latency counter values of the electrical devices are the same.

10. The testing circuit according to claim 1, wherein each of the electrical devices is a memory chip.

11. A device under test, comprising:
- a plurality of electrical devices, disposed on a substrate; and
- a testing circuit, comprising:
- a first pad, disposed on a scribe line of the substrate, and configured to receive a trigger signal to trigger the electrical devices to sequentially perform a testing operation, wherein the electrical devices are disposed on the substrate; and
- a plurality of delay circuits, coupled in series, disposed on the scribe line of the substrate, and electrically connected to the first pad, wherein the delay circuits are configured to delay the trigger signal in sequence to respectively output a plurality of delayed trigger signals to the corresponding electrical devices,
- wherein the electrical devices sequentially perform the testing operation according to the delayed trigger signals so as to respectively output a plurality of testing results,
- wherein each of the electrical devices comprises:
  - a storage circuit, being configured to receive the corresponding delayed trigger signal and store a latency counter value of the electrical device, wherein the latency counter value is obtained by adding a corresponding reference counter value with a delayed time period of corresponding delayed trigger signal,
- wherein each of the electrical devices determines a time point for outputting the testing result according to the latency counter value.

12. The device under test according to claim 11, wherein the testing circuit further comprises:
- a plurality of second pads, disposed on the scribe line of the substrate, and electrically connected to the electrical devices, wherein the second pads are configured to receive a clock signal, a power signal, and a test command and output the clock signal, the power signal, and the test command to the electrical devices,
- wherein the electrical devices perform the testing operation according to the clock signal, the power signal, and the test command.

13. The device under test according to claim 12, wherein each of the electrical devices further comprises:
- a logic circuit, electrically connected to the second pads, and configured to receive and output the clock signal and the test command;
- a built-in self-test circuit, electrically connected to the logic circuit, and configured to perform the testing operation according to the clock signal and the test command; and
- a data bus, electrically connected to the built-in self-test circuit, and configured to output the testing result.

14. The device under test according to claim 13, wherein each of the electrical devices comprises:
- an input pad, electrically connected to the corresponding delay circuit, and configured to receive and output the delayed trigger signal.

15. The device under test according to claim 14, wherein the storage circuit is electrically connected to the input pad, and configured to receive the corresponding delayed trigger signal from the input pad.

16. The device under test according to claim 15, wherein the data bus is electrically connected to the storage circuit and configured to output each of the testing results according to the latency counter value.

17. The device under test according to claim 15, wherein the latency counter values of the electrical devices are different.

18. The device under test according to claim 14, wherein the logic circuit is further electrically connected to the input pad and configured to receive and output the delayed trigger signal, and the built-in self-test circuit is further configured to perform the testing operation according to the corresponding delayed trigger signal so as to output each of the testing results.

19. The device under test according to claim 15, wherein the latency counter values of the electrical devices are the same.

20. The device under test according to claim 11, wherein each of the electrical devices is a memory chip.

* * * * *